(12) United States Patent
Miwa et al.

(10) Patent No.: US 7,928,541 B2
(45) Date of Patent: Apr. 19, 2011

(54) COPPER ALLOY SHEET AND QFN PACKAGE

(75) Inventors: Yosuke Miwa, Shimonoseki (JP); Masayasu Nishimura, Shimonoseki (JP); Ryoichi Ozaki, Shimonoseki (JP); Shinya Katsura, Shimonoseki (JP)

(73) Assignee: Kobe Steel, Ltd., Kobe-shi (JP)

( * ) Notice: Subject to any disclaimer, the term of this patent is extended or adjusted under 35 U.S.C. 154(b) by 138 days.

(21) Appl. No.: 12/363,974

(22) Filed: Feb. 2, 2009

(65) Prior Publication Data

US 2009/0224379 A1 Sep. 10, 2009

(30) Foreign Application Priority Data

Mar. 7, 2008 (JP) ................................ 2008-057264
Mar. 18, 2008 (JP) ................................ 2008-070469

(51) Int. Cl.
  *H01L 23/495* (2006.01)
(52) U.S. Cl. ....................... 257/666; 257/672
(58) Field of Classification Search .................. 257/666, 257/677, 672
  See application file for complete search history.

(56) References Cited

U.S. PATENT DOCUMENTS

| | | | | |
|---|---|---|---|---|
| 4,605,532 A | * | 8/1986 | Knorr et al. ................... | 420/472 |
| 4,632,806 A | * | 12/1986 | Morikawa et al. ............. | 420/479 |
| 6,132,529 A | | 10/2000 | Hatakeyama et al. | |
| 6,558,617 B2 | | 5/2003 | Miwa | |
| 6,700,192 B2 | | 3/2004 | Matsuzawa et al. | |
| 2006/0016528 A1 | * | 1/2006 | Hatakeyama ................. | 148/684 |
| 2006/0137773 A1 | | 6/2006 | Aruga et al. | |
| 2006/0186544 A1 | * | 8/2006 | Won et al. ..................... | 257/741 |
| 2007/0092991 A1 | | 4/2007 | Masumoto | |
| 2009/0014102 A1 | * | 1/2009 | Hatakeyama ................. | 148/684 |

FOREIGN PATENT DOCUMENTS

| | | |
|---|---|---|
| CN | 101001965 A | 7/2007 |
| EP | 1 612 285 A1 | 1/2006 |
| EP | 2 088 214 A1 | 8/2009 |
| GB | 2 158 095 A | 11/1985 |
| JP | 2002-194461 | 7/2002 |
| JP | 2003-124420 | 4/2003 |
| JP | 2003-347494 | 12/2003 |
| JP | 2007-123327 | 5/2007 |

OTHER PUBLICATIONS

U.S. Appl. No. 12/374,154, filed Jan. 16, 2009, Aruga, et al.
U.S. Appl. No. 12/441,904, filed Mar. 19, 2009, Aruga, et al.

* cited by examiner

*Primary Examiner* — S. V Clark
(74) *Attorney, Agent, or Firm* — Oblon, Spivak, McClelland, Maier & Neustadt, L.L.P.

(57) ABSTRACT

A QFN package is provided with a lead frame formed by processing a copper alloy sheet containing 0.01 to 0.50% by mass Fe, 0.01 to 0.20% by mass P, and Cu and inevitable impurities as other components, having a micro Vickers hardness of 150 or above, a uniform elongation of 5% or below and a local elongation of 10% or below, or a copper alloy sheet containing 0.05 to 2% by mass Ni, 0.001 to 0.3% by mass P, 0.005 to 5% by mass Zn, and Cu and inevitable impurities as other components, having a micro Vickers hardness of 150 or above, a uniform elongation of 5% or below and a local elongation of 10% or below. Lead burrs formed during the dicing of the QFN package are short, and a dicing blade used for dicing the QFN package is abraded at a low wear-out rate.

13 Claims, 3 Drawing Sheets

COPPER ALLOY SHEET AND QFN PACKAGE

BACKGROUND OF THE INVENTION

1. Field of the Invention

The present invention relates to a copper alloy sheet for forming electronic devices, such as semiconductor devices and, more particularly to a copper alloy sheet for forming QFN packages that need to be processed by dicing and a QFN package having a lead frame made from the copper alloy sheet.

2. Description of the Related Art

Recently, QFN packages have become prevalently used and have progressively replaced packages provided with external leads represented by QFPs and leadless packages, such as CSPs and BGAs.

QFNs have become prevalently used not only because the existing QFP production lines can be used for manufacturing QFN packages, but also because QFN packages have a small area as well as BGAs and QFN packages can be formed in a small thickness comparable to that of CSPs. The QFN package having a metal lead frame can be produced at a high productivity and is superior to BGA in reliability. Since a heat spreader for heat dissipation can be formed on the back surface of the QFN package, any heat sink like that needed by BGAs and CSPs is unnecessary and hence the QFN package can be manufactured at a low cost.

To assemble the QFN package efficiently, lead frame patterns are arranged in a 5×5 or 10×10 matrix, chips are mounted on the lead frames, packages are formed simultaneously by molding a resin after the completion of a wire bonding process. Then the QFN packages are divided into individual QFN packages by dicing. Such a technique is disclosed in JP-A 2003-347494, JP-A 2003-124420 and JP-A 2007-123327. Originally, the dicing process is a process using a very thin dicing blade coated with diamond dust for cutting a wafer into Si chips. This dicing process is applied to cutting the resin molding having the lead frame patterns arranged in a 5×5 or 10×10 matrix into individual QFN packages.

In a QFN package assembling procedure including the dicing process, external leads of the lead frame are cut in the dicing process. Therefore, the lead frame needs to be formed of a material excellent in dicing workability.

Formation of burrs in the external leads cut by the dicing blade, which are called lead burrs, and the abrasion of the dicing blade are problems in the dicing process. Long burrs formed on the cut leads make stable soldering for mounting packages on a substrate impossible, reduce the productivity of a mounting process and deteriorates the reliability of the packages. The rapid abrasion of the dicing blade increases dressing frequency, and the use of a greatly worn out dicing blade produces packages of sizes different from a desired size, and reduces productivity and the yield of packages. Thus, a material for forming a lead frame for QFN packages needs to be capable of reducing lead burrs to the least possible extent and of suppressing the abrasion of the dicing blade as effectively as possible.

Conventional QFP lead frames disclosed in JP-A 2003-124420 and JP-A 2007-123327 are made of copper, a copper alloy and a Fe—Ni alloy, respectively. The copper alloy is an alloy designated by CDA194 containing Cu as a principal component, 2.3% by mass Fe, 0.03% by mass P and 0.13% by mass Zn. The alloy CDA194 is unsatisfactory in satisfactorily reducing lead burrs and in suppressing the abrasion of the dicing blade. Thus, a lead frame material still more excellent in dicing workability has been desired.

SUMMARY OF THE INVENTION

The present invention has been made to meet such a desire and it is therefore an object of the present invention to provide a copper alloy sheet suitable for use as a lead frame material for forming QFN packages provided by dicing, and to provide a QFN package provided with a lead frame pattern formed by processing the copper alloy sheet of the present invention.

A copper alloy sheet in a first aspect of the present invention for QFN packages contains 0.01 to 0.50% by mass Fe, 0.01 to 0.20% by mass P, and Cu and inevitable impurities as other components, has a micro Vickers hardness of 150 or above, a uniform elongation of 5% or below and a local elongation of 10% or below.

This copper alloy may contain (1) 0.005 to 5% by mass Sn, (2) 0.005 to 3.0% by mass Zn, (3) 0.2% by mass or below Co, Cr, Mn and Mg in total or (4) 0.1% by mass or below Al, Ag, B, Be, In, Si, Ti and Zr in total or a combination of some of (1) to (4).

Uniform elongation and local elongation of the copper alloy sheet in the first aspect of the present invention are measured by subjecting a test piece having the form of a test piece of the type No. 5 specified in JIS and a thickness of 0.15 mm to a tensile test that pulls the test piece longitudinally in the rolling direction.

A QFN package including a lead frame made by processing the copper alloy sheet in the first aspect of the present invention is within the scope of the present invention.

A copper alloy sheet in a second aspect of the present invention for QFN packages contains 0.05 to 2% by mass Ni, 0.001 to 0.3% by mass P, 0.005 to 5% by mass Zn, and Cu and inevitable impurities as other components, has a micro Vickers hardness of 150 or above, a uniform elongation of 5% or below and a local elongation of 10% or below.

This copper alloy may contain (1) either of 1% by mass or below Fe and 1.5% by mass or below Sn, (2) 0.2% by mass or below Co, Cr, Mn, Mg and Si in total or (3) 0.1% by mass or below Al, Zr, In, Ti, B, Ag and Be in total or a combination of some of (1) to (3).

Uniform elongation and local elongation of the copper alloy sheet in the second aspect of the present invention are measured under the same conditions as those of the copper alloy sheet in the first aspect of the present invention.

A QFN package including a lead frame made by processing the copper alloy sheet in the second aspect of the present invention is within the scope of the present invention.

When a QFN package assembly provided with a lead frame formed by processing the copper alloy sheet of the present invention is subjected to a dicing process, burrs (lead burrs) on external leads can be reduced, the abrasion of a dicing blade employed in the dicing process can be suppressed. Consequently, the productivity of a QFN package fabricating process, the yield of QFN packages and the quality of QFN packages can be improved.

BRIEF DESCRIPTION OF THE DRAWINGS

The above and other objects, features and advantages of the present invention will become apparent from the following description taken in connection with the accompanying drawings, in which.

DESCRIPTION OF THE PREFERRED EMBODIMENTS

Matters common to a first and a second embodiment of the present invention will be described.

Properties required to improve the dicing workability of a copper alloy sheet will be described.

A copper alloy sheet according to the present invention has a micro Vickers hardness (hereinafter, abbreviated to "MHv") of 150 or above. If the MHv is below 150, the strength of the copper alloy sheet is insufficient, abrasive grains (diamond grains) of a dicing blade bite deep into the copper alloy sheet during a dicing process, a large amount of the copper alloy is cut out and, consequently, large lead burrs are liable to be formed. From the view point of suppressing the formation of lead burrs, it is desirable that the MHv is 160 or above. Although an upper limit MHv is not specified, a copper alloy sheet having a composition meeting conditions specified by the present invention and manufactured by a manufacturing method according to the present invention has a MHv of about 300 or below.

The copper alloy sheet of the present invention has a uniform elongation of 5% or below and a local elongation of 10% or below. If the uniform elongation is above 5%, the copper alloy sheet has an excessively high ductility. Consequently, parts of the copper alloy sheet cut out by the dicing blade are not torn off easily and tend to lengthen. Consequently, large lead burrs are liable to be formed. From the viewpoint of suppressing the formation of lead burrs, it is more desirable that the uniform elongation is 4% or below. If the local elongation is above 10%, the copper alloy sheet has an excessively high ductility. Consequently, parts of the copper alloy sheet cut out by the dicing blade are not torn off easily and tend to lengthen. Consequently, large lead burrs are liable to be formed. From the viewpoint of suppressing the formation of lead burrs, it is more desirable that the local elongation is 6% or below. Although a lower limit local elongation is not particularly specified, a copper alloy sheet having a composition meeting conditions specified by the present invention and manufactured by a manufacturing method according to the present invention has a uniform elongation of 0.5% or above and a local elongation of 2% or above.

The MHv, uniform elongation and local elongation of the copper alloy sheet influence the abrasion of the dicing blade. If the MHv is excessively low, abrasive grains of the dicing blade bite deep into the copper alloy sheet. If the uniform elongation and the local elongation are excessively high, parts of the copper alloy sheet cut out by the dicing blade are not torn off easily. Consequently, high resistance acts on the raking action of the dicing blade and the dicing blade is liable to be rapidly abraded. From the view point of suppressing the abrasion of the dicing blade, the proper MHv of the copper alloy sheet is 150 or above, desirably, 160 or above, the proper uniform elongation is 5% or below, desirably, 4% or below, and the proper local elongation is 10% or below, desirably, 6% or below.

Uniform elongation is a plastic extension produced along a gage length of a tensile test piece up to the stage when the maximum load is reached and local elongation is a plastic extension between a stage when the maximum load is reached and a stage when the fracture load is reached.

The composition of a first copper alloy forming a copper alloy sheet in a first embodiment according to the present invention will be described.

The first copper alloy contains, as essential components, 0.01 to 0.5% by mass Fe, and 0.001 to 0.20% by mass P.

Iron (Fe) precipitates in Fe or in a Fe—P compound and enhances the strength and heat resistance of the copper alloy. When the Fe content is below 0.01% by mass, the amount of precipitated Fe of the Fe—P compound is small, the copper alloy sheet has an insufficient strength and large burrs are formed by dicing work. When the Fe content is above 0.5% by mass, the copper alloy sheet has a low electric conductivity, Fe and Fe—P compound grow in coarse grains, and the dicing blade wears out rapidly at a high wear-out rate. Therefore, the Fe content is in the range of 0.01 to 0.50% by mass, desirably, in the range of 0.05 to 0.45% by mass.

Phosphorus (P) has a deoxidation effect, and forms a Fe—P compound together with Fe to improve strength and heat resistance. When the P content is below 0.01% by mass, a small amount of the Fe—P compound precipitates. Consequently, the copper alloy sheet has an insufficient strength and large burrs' are formed by dicing work. When the P content is above 0.2% by mass, the copper alloy sheet has a low electric conductivity, the hot workability of the copper alloy deteriorates, coarse Fe—P compound grains crystallize, and the dicing blade is abraded at a high wear-out rate. Thus, the P content is in the range of 0.01 to 0.20% by mass, desirably, in the range of 0.02 to 0.15% by mass.

The copper alloy of the first embodiment of the present invention may contain, when necessary, (1) 0.005 to 5% by mass Sn, (2) 0.005 to 3.0% by mass Zn, (3) 0.2% by mass or below Co, Cr Mn and Mg in total or (4) 0.1% by mass or below Al, Ag, B, Be, In, Si, Ti and Zr in total or a combination of some of (1) to (4) as subsidiary components.

Tin (Sn) contributes to the enhancement of the strength of the copper alloy and has an effect on improving dicing workability. Tin (Sn) does not have the effect on enhancing the strength and does not improve dicing workability when the Sn content is below 0.005% by mass. A Sn content above 5% by mass reduces electric conductivity. Therefore, the Sn content is in the range of 0.005 to 5.0% by mass, desirably, in the range of 0.01 to 4.5% by mass.

Zinc (Zn) has effects required of a lead frame on improving the heat resistance and peel resistance of solder and plated tin films. Those effects are insignificant when the Zn content is below 0.005% by mass. A Zn content above 3% by mass affects adversely to the electric conductivity of the copper alloy for forming a lead frame. Therefore, the Zn content of the copper alloy material is in the range of 0.005 to 3% by mass, desirably, 0.01 to 2.5% by mass. It is desirable that a material for lead frames has an electric conductivity of 25% IACS or above. Cobalt (Co), Cr, Mn and Mg combine with P and precipitate in chemical compounds to improve strength, heat resistance and dicing workability. However, coarse crystalline grains precipitate, a dicing blade is abraded at a high wear-out rate, some elements, such as Mn and Mg, reduce solder wettability when the copper alloy contains one or some of those elements in a total content above 0.2% by mass. Therefore, the copper alloy shall contain one or some of Co, Cr, Mn and Mg in a total content of 0.2% by mass or below.

Aluminum (Al), Ag, B, Be, In, Si, Ti and Zr form a solid solution, precipitate individually or precipitate in combination with other components to improve strength and dicing workability. However solder wettability and cost increases when the copper alloy contains one or some of those elements in a total content above 0.1% by mass. Therefore, the copper alloy shall contain one or some of Al, Ag, B, Be, In, Si, Ti and Zr in a total content of 0.1% by mass or below.

Oxygen (O) and P interact easily. When an O content exceeds 100 ppm, precipitates are produced insufficiently, strength is reduced, and dicing workability and solder wettability worsen. Desirably the sum of the O content and the P content is 100 ppm or below, more desirably, 50 ppm or below. When the H content is above 5 ppm, H combines with O to produce steam which forms blow holes during casting to cause defects in products. Desirably, the H content is 5 ppm or below, more desirably, 3 ppm or below. When the S content is above 100 ppm, cracks form in a copper alloy sheet during hot rolling and lead frames cannot be formed from such a copper alloy sheet. Desirably, the S content is 100 ppm or below, more desirably, 50 ppm or below.

The copper alloy sheet in the first embodiment can be manufactured by subjecting a copper alloy ingot to a homogenizing process, subjecting the homogenized copper alloy ingot to hot rolling to produce a hot-rolled copper alloy sheet, quenching the hot-rolled copper alloy sheet, subjecting the hot-rolled copper alloy sheet to cold rolling and annealing, subjecting the copper alloy sheet again to cold rolling and annealing when necessary, subjecting the cold-rolled copper alloy sheet to finish cold rolling, and then subjecting the copper alloy sheet to low-temperature annealing. It is desirable that all the annealing processes are controlled so that recrystallized grains have a mean grain size of 50 µm or below or recrystallization may not occur and the percentage rolling reduction for the finish cold rolling is 40% or above to manufacture a copper alloy sheet having a MHv of 150 or above, a uniform elongation of 5% or below and a local elongation of 10% or below. During annealing Fe or a Fe-compound precipitates and enhances the strength and heat resistance of the copper alloy sheet. To obtain a finished copper alloy sheet having a MHv of 150 or above, the copper alloy sheet is annealed by heating the copper alloy sheet at a temperature in the range of 200° C. to 600° C. for a time in the range of 0.5 to 10 h. Desirably, conditions for low-temperature annealing are determined such that the MHv of the annealed copper alloy sheet is in the range of 65% to 95% of the MHv of the copper alloy sheet before annealing. Low-temperature annealing heats the copper alloy sheet at a temperature in the range of 200° C. to 500° C. for a time in the range of about 1 s to about 2 h.

If the mean grain size of recrystallized grains exceeds 50 µm after annealing (even after one of a plurality of annealing cycles), the copper alloy softens excessively and it is therefore difficult to form a copper alloy sheet having a MHv of 150 or above. If the percentage rolling reduction for the finish rolling is below 40%, it is difficult to obtain a finished copper alloy sheet having a MHv of 150 or above. Although ductility can be recovered when the MHv of the copper alloy sheet after the final low-temperature annealing is in the range of 65% to 95% of the MHv of the copper alloy sheet before the low-temperature annealing, the uniform elongation and the local elongation are excessively large if the MHv after the low-temperature annealing is below 65% of the MHv before the low-temperature annealing. Such a MHv is excessively low. Correction of warped sheet and the reduction of internal stress cannot be satisfactorily achieved and there is the possibility that a high flatness required of a copper alloy sheet for forming lead frames cannot be achieved if the MHv after the low-temperature annealing is above 95% of the MHv before the low-temperature annealing.

The composition of a second copper alloy forming a copper alloy sheet in a second embodiment according to the present invention will be described.

The second copper alloy contains, as essential components, 0.05 to 2% by mass Ni, 0.001 to 0.3% by mass P and 0.005 to 5% by mass Zn.

An intermetallic compound of Ni and P precipitates. The intermetallic compound enhances the strength and heat resistance of the copper alloy. When the Ni content is below 0.05 and the P content is below 0.001% by mass, the amount of precipitated intermetallic compound is small, the strength and heat resistance of the copper alloy sheet is insufficient and the dicing workability of the copper alloy sheet is unsatisfactory. A Ni content above 0.2% by mass affects adversely to the electric conductivity of lead frames. The P content needs to be 0.3% by mass or above if the P content is increased so as to correspond to the high Ni content with an intention to secure electric conductivity by precipitating a Ni—P compound. If the P content is increased for such a purpose, large crystal grains are liable to be produced in the copper alloy and the ability of the copper alloy to be processed by hot processes to form a copper alloy sheet deteriorates. Thus, the copper alloy shall have a Ni content in the range of 0.05 to 2% by mass and a P content in the range of 0.001 to 0.3% by mass. From the view point of preventing the crystallization of coarse grains and suppressing the abrasion of a dicing blade, it is desirable that the Ni content is in the range of 0.07 to 1.7% by mass, more desirably, 0.1 to 1.5% by mass, and the P content is in the range of 0.005 to 0.27% by mass, more desirably, in the range of 0.01 to 0.2% by mass.

Zinc (Zn) has effects required of a lead frame on improving the heat resistance and peel resistance of solder and plated tin films. Those effects are insignificant when the Zn content is below 0.005% by mass. A Zn content above 5% by mass affects adversely to the electric conductivity of the copper alloy for forming a lead frame. Therefore, the Zn content of the copper alloy is in the range of 0.005 to 5% by mass, desirably, 0.01 to 3% by mass, more desirably 0.01 to 2% by mass from the viewpoint of ensuring satisfactory electric conductivity and improving the heat resistance and peel resistance. It is desirable that a material for lead frames has an electric conductivity of 25% IACS or above.

The copper alloy of the second embodiment of the present invention may contain in addition to Ni, P and Zn, when necessary, (1) Fe and/or Sn, (2) one or some of Co, Cr, Mn, Mg and Si, and (one or some of Al, Zr, In, Ti, B, Ag and Be individually or in combination as subsidiary components.

Iron (Fe) precipitates in a Fe—P intermetallic compound and enhances the strength and heat resistance of the copper alloy. Fe is added to the copper alloy when necessary. When the Fe content is above 1% by mass, coarse grains are liable to crystallize in the copper alloy and dicing workability is deteriorated. Therefore the Fe content shall be 1% by mass or below. From the viewpoint of crystallizing proper grains, a desirable Fe content is 0.7% by mass or below.

Tin (Sn) produces a solid solution in the copper alloy and has an effect on enhancing the strength of the copper alloy. A Sn content above 1.5% by mass affects adversely the electric conductivity of the copper alloy for forming lead frames. The Sn content of the copper alloy shall be below 1.5% by mass. From the viewpoint of ensuring satisfactory electric conductivity, a desirable Sn content is 1.3% by mass or below.

Cobalt (Co), Cr, Mn, Mg and Si combine with P or Ni and precipitate in chemical compounds (Co, Cr, Mn and Mg combine with P and precipitate in chemical compounds of Co, Cr, Mn and Mg, and, P, and Si combines with Ni and precipitates in a Si—Ni compound) to improve strength, heat resistance and dicing workability. However, coarse crystalline grains precipitate, a dicing blade is abraded at a high wear-out rate and solder wettability deteriorates if the copper alloy contains one or some of Co, Cr, Mn, Mg and Si in a total content above 0.2% by mass. Therefore, the copper alloy shall contain one or some of Co, Cr, Mn, Mg and Si in a total content of 0.2% by mass or below.

Aluminum (Al), Zr, In, Ti, B, Ag and Be form a solid solution, precipitate individually or precipitate in combination with other components to improve strength and dicing workability. However solder wettability and cost increases when the copper alloy contains one or some of those elements in a total content above 0.1% by mass. Therefore, the copper alloy shall contain one or some of Al, Zr, In, Ti, B, Ag and Be in a total content of 0.1% by mass or below.

Oxygen (O) and P interact easily. When the sum of an O content and a P content exceeds 100 ppm, wettability is deteriorated. Desirably the sum of the O content and the P content is 100 ppm or below, more desirably, 50 ppm or below. When the H content is above 5 ppm, H combines with O to produce steam which forms blow holes during casting to cause defects in products. Desirably, the H content is 5 ppm or below, more desirably, 3 ppm or below. When the S content is above 100 ppm, cracks form in a copper alloy sheet during hot rolling. Desirably, the S content is 100 ppm or below, more desirably, 50 ppm or below.

The copper alloy sheet in the second embodiment can be manufactured by subjecting a copper alloy ingot to a homogenizing process, subjecting the homogenized copper alloy ingot to hot rolling to produce a hot-rolled copper alloy sheet, quenching the hot-rolled copper alloy sheet, subjecting the hot-rolled copper alloy sheet to cold rolling and annealing, subjecting the copper alloy sheet again to cold rolling and annealing when necessary, subjecting the cold-rolled copper alloy sheet to finish cold rolling, and then subjecting the copper alloy sheet to low-temperature annealing. The starting temperature of homogenization and hot rolling is in the range of 750° C. to 950° C. The cold-rolled copper alloy sheet is subjected to an annealing process to precipitate a Ni—P compound and such. When cold rolling and annealing are repeated, at least one annealing cycle needs to precipitate a Ni—P compound. An annealing process for producing a solid solution of the NI—P compound, namely, a solution treatment, for producing a slid solution of the Ni—P compound and such precipitated in a casting process, during hot rolling or in the cold rolling process succeeding the hot rolling process may be carried out before annealing the copper alloy sheet for precipitation. It is desirable that all the annealing processes are controlled so that recrystallized grains have a mean grain size of 50 μm or below or recrystallization may not occur and the percentage rolling reduction for the finish cold rolling is 40% or above to manufacture a copper alloy sheet having a MHv of 150 or above, a uniform elongation of 5% or below and a local elongation of 10% or below. To obtain a finished copper alloy sheet having a MHv of 150 or above, the copper alloy sheet is annealed, for example, by heating the copper alloy sheet at a temperature in the range of 200° C. to 600° C. for a time in the range of 0.5 to 10 h. The solution treatment for annealing may be carried out, for example, at a temperature in the range of 550° C. to 750° C. for a time in the range of 5 s to 5 min. Under such annealing conditions, the copper alloy sheet can be annealed by a continuous annealing machine. Desirably, conditions for low-temperature annealing are determined such that the MHv of the annealed copper alloy sheet is in the range of 65% to 95% of the MHv of the copper alloy sheet before annealing. Low-temperature annealing heats the copper alloy sheet at a temperature in the range of 200° C. to 500° C. for a time in the range of about 1 s to about 2 h.

If the mean grain size of recrystallized grains exceeds 50 μm after annealing (even after one of a plurality of annealing cycles), the copper alloy softens excessively and it is therefore difficult to form a copper alloy sheet having a MHv of 150 or above. If the percentage rolling reduction for the finish rolling is below 40%, it is difficult to obtain a finished copper alloy sheet having a MHv of 150 or above. Although ductility can be recovered when the MHv of the copper alloy sheet after the final low-temperature annealing is in the range of 65% to 95% of the MHv of the copper alloy sheet before the low-temperature annealing, the uniform elongation and the local elongation are excessively large if the MHv after the low-temperature annealing is below 65% of the MHv before the low-temperature annealing. Such a MHv is excessively low. The reduction of internal stress in the sheet cannot be satisfactorily achieved and there is the possibility that intervals between adjacent leads and sizes of leads of a lead frame formed by processing the copper alloy sheet change and a high flatness required of a copper alloy sheet for forming lead frames cannot be achieved if the MHv after the low-temperature annealing is above 95% of the MHv before the low-temperature annealing.

First Embodiment

Examples of the first embodiment of the present invention will be described.

Copper alloys having compositions Nos. 1 to 21 shown in Table 1 and covered with charcoal were melted in the atmosphere in a small electric furnace. The molten copper alloys were cast in ingots of 50 mm in thickness, 80 mm in width and 180 mm in length. Front and back surface layers of 5 mm in thickness of each of the ingots were removed by facing. The ingots were hot-rolled at 950° C. to obtain 12 mm thick copper alloy plates. Surface layers of about 1 mm in thickness of the front and the back surface of each copper alloy plate were removed by facing. Many blow holes were formed in the ingot of the copper alloy of the composition No. 20 and cracks formed in the copper alloy plate of the copper alloy having the composition No. 21 during hot rolling. Therefore, the copper alloy plates of the compositions Nos. 20 and 21 were not processed by processes following hot rolling.

TABLE 1

Chemical composition (percent by mass, **: ppm), Percentage rolling reduction for finish cold rolling (%)

| No | Fe | P | Sn | Zn | Other components | O** | H** | S** | Reduction ratio |
|----|------|------|-----|----|------------------|------|-----|------|-----------------|
| 1  | 0.05 | 0.02 | —   | —  | —                | <100 | <5  | <100 | 80              |
| 2  | 0.1  | 0.03 | —   | —  | —                |      |     |      | 80              |
| 3  | 0.3  | 0.1  | —   | —  | —                |      |     |      | 80              |
| 4  | 0.45 | 0.15 | —   | —  | —                |      |     |      | 80              |
| 5  | 0.3  | 0.1  | 0.1 | —  | —                |      |     |      | 80              |
| 6  | 0.3  | 0.1  | 1   | —  | —                |      |     |      | 80              |

TABLE 1-continued

Chemical composition (percent by mass, **: ppm), Percentage rolling reduction for finish cold rolling (%)

| No | Fe | P | Sn | Zn | Other components | O** | H** | S** | Reduction ratio |
|---|---|---|---|---|---|---|---|---|---|
| 7 | 0.3 | 0.1 | 1 | 1 | — | | | | 80 |
| 8 | 0.3 | 0.15 | — | — | 0.1Co, 0.05Mn | | | | 80 |
| 9 | 0.3 | 0.1 | — | — | 0.05Al, 0.03In | | | | 80 |
| 10 | 0.3 | 0.15 | — | — | 0.05Cr, 0.05Mg 0.03Ag 0.03Si | | | | 80 |
| 11 | 0.005* | 0.005* | — | — | — | | | | 80 |
| 12 | 1* | 0.5* | — | — | — | | | | 80 |
| 13 | 0.1 | 0.03 | — | — | — | | | | 30 |
| 14 | 0.2 | 0.06 | — | — | — | | | | 35 |
| 15 | 0.3 | 0.1 | — | — | — | | | | 25 |
| 16 | 0.45 | 0.15 | — | — | — | | | | 20 |
| 17 | 0.3 | 0.15 | — | — | 0.10Co, 0.20Mg* | | | | 80 |
| 18 | 0.3 | 0.1 | — | — | 0.10Al, 0.10Ti* | | | | 80 |
| 19 | 0.3 | 0.1 | — | — | — | 150* | 1.5 | 20 | 80 |
| 20 | 0.3 | 0.1 | — | — | — | 30 | 10* | 30 | 80 |
| 21 | 0.3 | 0.1 | — | — | — | 25 | 1.0 | 140* | 80 |

*Excessive or insufficient content

The copper alloy plates were subjected to cold rolling, annealing and finish cold rolling to obtain copper alloy sheets of 0.15 mm in thickness. Annealing heated the copper alloy sheets at a temperature in the range of 200° C. to 600° C. for a time in the range of 0.5 to 10 h. Annealing conditions were selectively determined such that re-crystallized grains had a mean grain size of 50 μm or below or re-crystallization would not occur. The copper alloy sheets were cold-rolled in a thickness such that the percentage rolling reduction for the finish cold rolling was 20% or above. Percentage rolling reductions for finish cold rolling are shown in Table 1.

The copper alloy sheets processed by finish cold rolling were subjected to low-temperature annealing for a time in the range of about 20 to about 300 s. Conditions for low-temperature annealing were selectively determined such that the MHv of each of the copper alloy sheets processed by low-temperature annealing was in the range of 65% to 95% of the MHv of the copper alloy sheet before low-temperature annealing.

Test pieces were sampled from the copper alloy sheets of the copper alloys having the compositions Nos. 1 to 16. Test pieces were subjected to property tests including a MHv test, a uniform elongation test, a local elongation test, a drag burr length measuring test, a blade abrasion test, an electric conductivity test and a solder wettability test. The test results are shown in Table 2 and the test procedures are executed as follows.

Hardness Test

The MHv of the test piece was measured by the Vickers hardness measuring method specified in Z 2244, JIS. The test force was 4.9 N.

Measurement of Uniform and Local Elongations

The test piece of the type No. 5 specified in JIS having a length in the rolling direction was sampled from each copper alloy sheet. The test piece was subjected to a tensile test to measure uniform and local elongations.

Measurement of Electric Conductivity

Electric conductivity was measured by the electric conductivity measuring method specified in H 0505, JIS. Electric conductivities of 25% IACS or above were taken to be acceptable.

Solder Wettability Test

A rectangular test piece was sampled from each copper alloy sheet and a surface of the test piece was coated with a rosin base mildly activated flux. Solder wetting time was measured by a meniscograph. Solder containing Sn, 3% by mass Ag and 0.5% by mass Cu and maintained at 260±5° C. was used for the test. A solder wetting time below 2 s was taken to be acceptable and a solder wetting time of 2 s or above was taken to be unacceptable. In Examples of the second embodiment, described later, only acceptable (circle) or unacceptable (cross) is shown.

Lead Drag Burr Length Measurement

Figure 1:
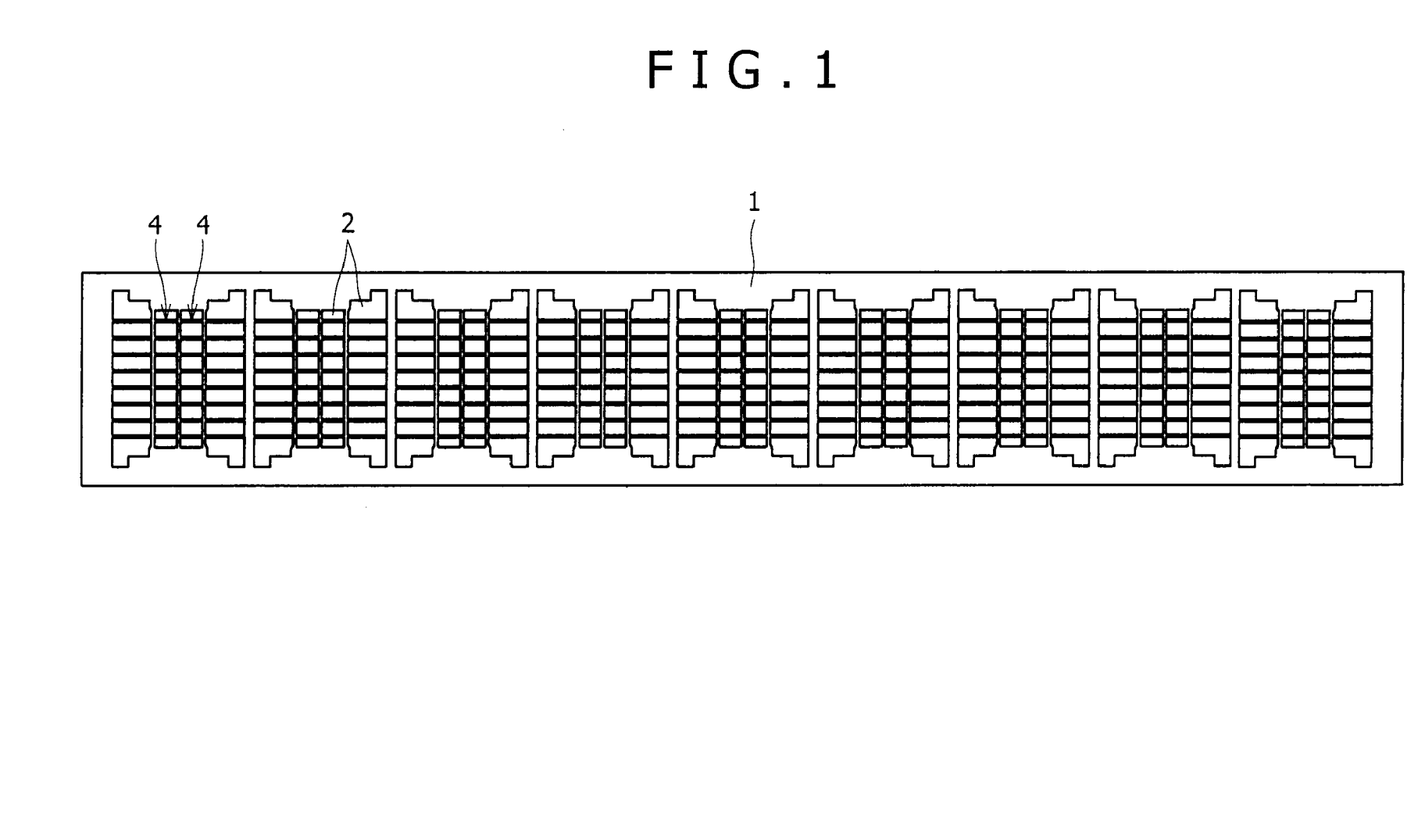
FIG. 1 is a plan view of a copper alloy lead frame formed by processing a copper alloy sheet in a preferred embodiment according to the present invention by an etching process.
Figure 2A:
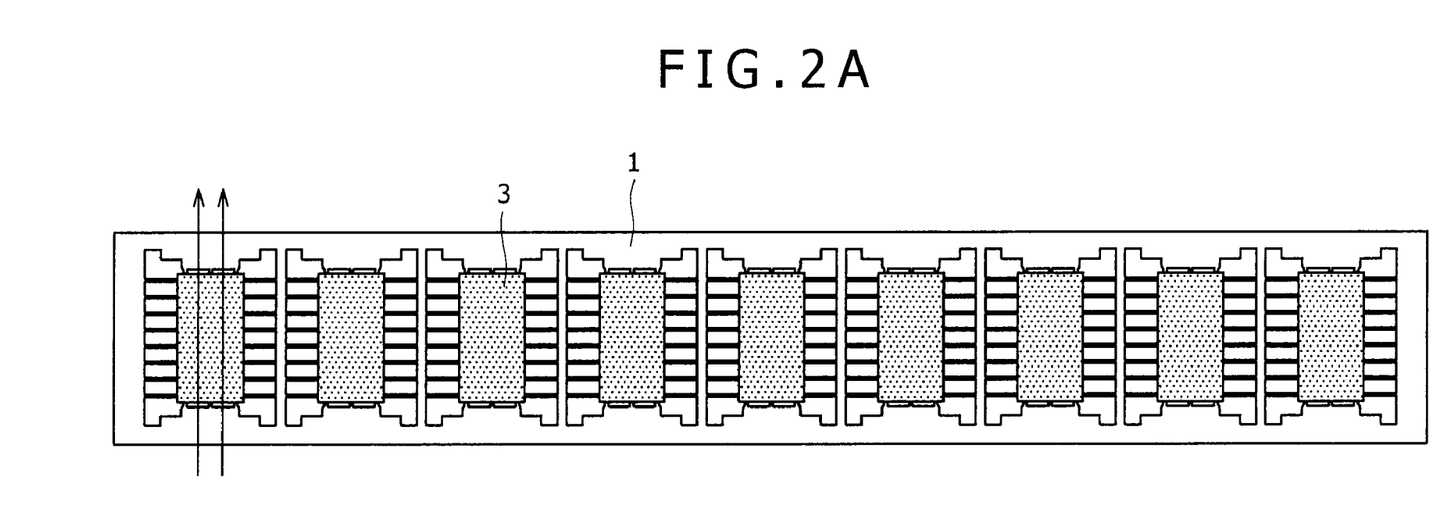
FIGS. 2A and 2B are a plan view and a side elevation, respectively, of the copper alloy lead frame in the preferred embodiment after resin molding.
Figure 2B:
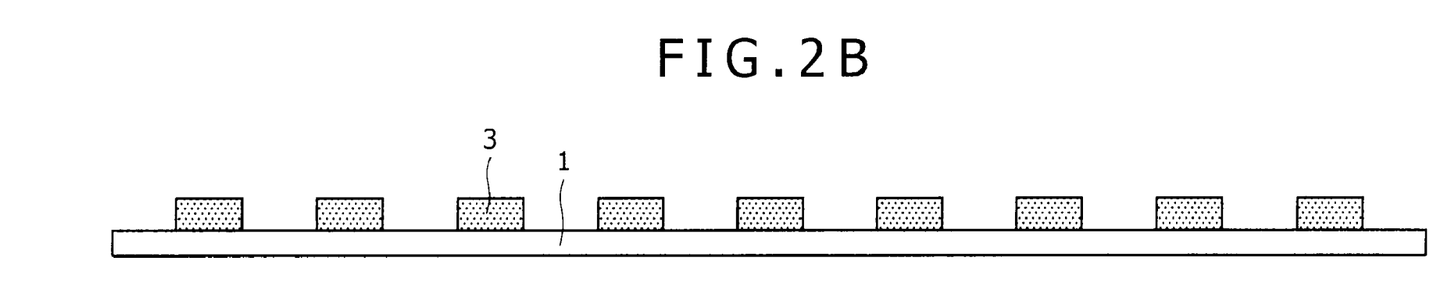

A test lead frame 1 shown in FIG. 1 was formed by etching the copper alloy sheet. In FIG. 1 parts of the copper alloy sheet removed by etching are indicated at 2. Test packages 3 shown in FIG. 2 were made by resin molding. The test packages 3 were cured at 175° C. for about 8 h and oxide films were removed by acid cleaning to obtain a test piece for a dicing test.

A resin-bonded diamond dicing blade having a surface grain size of #360 and an electrocast diamond dicing blade having a surface grain size of #400 were used for the dicing test.

Eight leads 4 (FIG. 1) of 0.25 mm in width coated with the resin of each package 3 were cut along two cutting lines perpendicular to the length of the lead frame. The two cutting lines are indicated by the arrows in FIG. 2A. The lengths of the respective maximum lead burrs in the leads extending in the direction of the width of the leads were measured and a mean length was calculated. Lead burrs having the mean length below 60 μm were taken to be acceptable.

Figure 3:
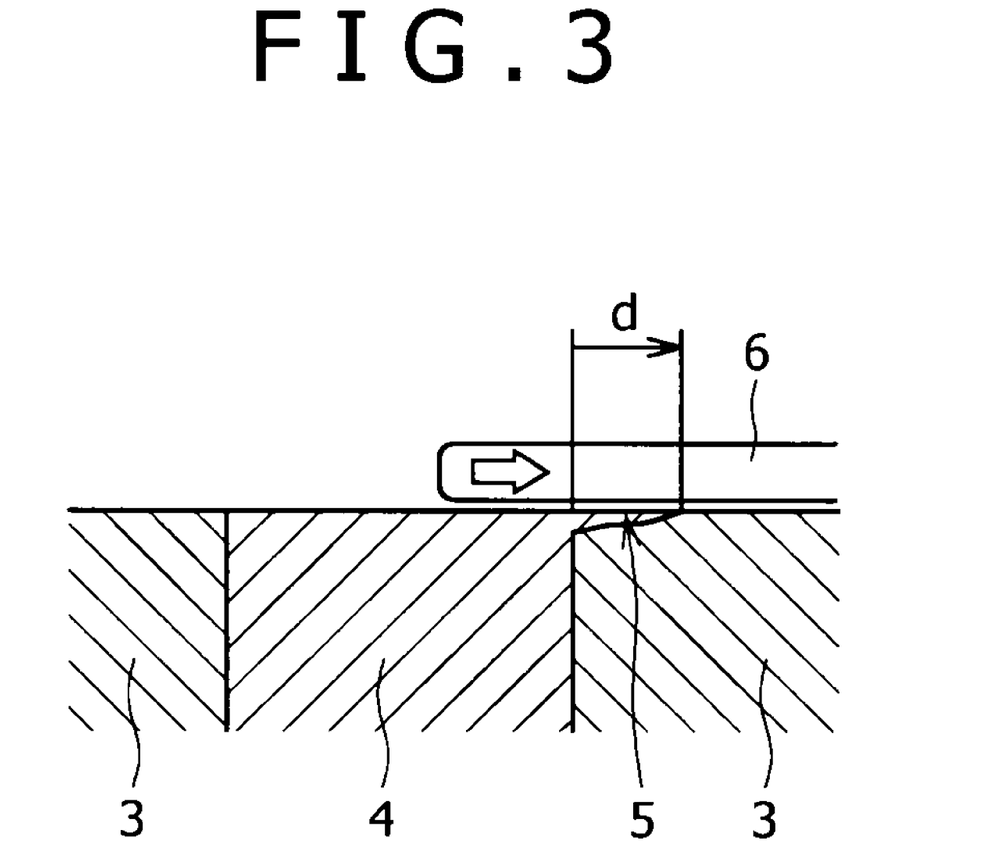
FIG. 3 is a typical view of assistance in explaining a lead drag burr.

A lead drag burr 5 is formed when a part of the lead cut out by a dicing blade 6 is stretched in the direction of the arrow parallel to the width of the lead as shown in FIG. 3. In FIG. 3, the length of the lead drag burr 5 is designated by d.

Abrasion Loss of Dicing Blade

The resin-bonded diamond dicing blade and the electrocast diamond dicing blade each having a diameter of 54 mm were tested. Two parts along two cutting lines of each of nine packages formed on each of five lead frames were cut with each of the dicing blades. An abrasion loss was represented by a diametrical reduction of the dicing blade. Abrasion losses below 70 μm were taken to be acceptable.

TABLE 2

| | | | | Length of drag burrs (μm) | | Abrasion of the dicing blade (μm) | | | |
|---|---|---|---|---|---|---|---|---|---|
| No. | Hardness (Hv) | Uniform elongation (%) | Local elongation (%) | Resin-bonded diamond dicing blade | Electrocast diamond dicing blade | Resin-bonded diamond dicing blade | Electrocast diamond dicing blade | Electric conductivity (% IACS) | Solder wettability (s) |
| 1 | 150 | 4 | 6 | 53 | 55 | 60 | 0.25 | 85 | 0.8 |
| 2 | 155 | 4 | 5 | 50 | 52 | 55 | 0.25 | 85 | 1.0 |
| 3 | 170 | 4 | 3 | 43 | 45 | 35 | 0.20 | 75 | 1.0 |
| 4 | 175 | 4 | 4 | 40 | 48 | 33 | 0.20 | 70 | 1.1 |
| 5 | 180 | 4 | 4 | 42 | 43 | 33 | 0.20 | 65 | 1.0 |
| 6 | 210 | 3 | 5 | 40 | 41 | 32 | 0.20 | 45 | 1.0 |
| 7 | 210 | 3 | 5 | 42 | 43 | 30 | 0.20 | 43 | 1.2 |
| 8 | 185 | 4 | 4 | 40 | 38 | 32 | 0.20 | 65 | 1.2 |
| 9 | 185 | 4 | 5 | 40 | 38 | 34 | 0.20 | 60 | 1.4 |
| 10 | 190 | 4 | 5 | 38 | 36 | 32 | 0.20 | 65 | 1.4 |
| 11 | 80* | 8* | 12* | 85* | 75* | 82* | 0.30 | 85 | 0.8 |
| 12 | 160 | 5 | 4 | 55 | 58 | 80* | 0.35 | 35 | 1.2 |
| 13 | 120* | 6* | 4 | 66* | 68* | 77* | 0.20 | 90 | 1.0 |
| 14 | 140* | 4 | 6 | 63* | 62* | 65* | 0.20 | 85 | 1.0 |
| 15 | 150 | 6* | 8 | 70* | 68* | 68* | 0.20 | 80 | 1.0 |
| 16 | 155 | 7* | 11* | 75* | 72* | 70* | 0.20 | 75 | 1.1 |
| 17 | 200 | 4 | 4 | 43 | 41 | 78* | 0.20 | 55 | 2.0* |
| 18 | 195 | 4 | 5 | 44 | 43 | 62 | 0.20 | 50 | 2.8* |
| 19 | 160 | 5 | 6 | 48 | 48 | 55 | 0.25 | 78 | 2.4* |

*Unsatisfactory property

As shown in Table 2, in the copper alloy sheets of the copper alloys having the compositions Nos. 1 to 10, having a uniform elongation and a local elongation meeting the requirements of the first embodiment, the lengths of lead burrs formed therein when the packages were cut by either of the resin-bonded diamond dicing blade and the electrocast diamond dicing blade were 60 μm or below. Abrasion losses in the resin-bonded diamond dicing blade and the electrocast diamond blade used for cutting the packages were below 70 μm. The measured data proved the excellent dicing workability of the lead frames. The lead frames of the copper alloys having the compositions Nos. 3 to 10 having uniform elongations and local elongations in the desired ranges were particularly excellent in dicing workability. The lead frames of the copper alloys having the compositions Nos. 5 to 10 containing Sn and the subsidiary components had high MHvs and excellent dicing workability.

In the copper alloy sheets of the copper alloys having the compositions Nos. 11 and 13 to 16, having a uniform elongation or a local elongation not meeting the requirements of the first embodiment, the lengths of lead burrs formed therein when the packages were cut by either of the resin-bonded diamond dicing blade and the electrocast diamond dicing blade were above 60 μm. An abrasion loss in the resin-bonded diamond dicing blade used for cutting the packages was above 70 μm, which proved that those copper alloy sheets were unsatisfactory in dicing workability.

The lead frame of the copper alloy having the compositions No. 12 having an excessively high Fe content caused a big abrasion loss in the resin-bonded diamond dicing blade had a low electric conductivity. The lead frame of the copper alloy having the composition No. 17 having an excessively high Co content and an excessively high Mg content caused a big abrasion loss in the resin-bonded diamond dicing blade, was unsatisfactory in solder wettability. The lead frame of the copper alloy having the composition No. 18 having an excessively high Al content and an excessively high Ti content and the lead frame of the copper alloy having the composition No. 19 having an excessively high O content were unsatisfactory in solder wettability.

Second Embodiment

Examples of the second embodiment of the present invention will be described.

Copper alloys having compositions Nos. 1 to 24 shown in Table 3 and covered with charcoal were melted in the atmosphere in a small electric furnace. The molten copper alloys were cast in ingots of 50 mm in thickness, 80 mm in width and 180 mm in length. Front and back surface layers of 5 mm in thickness of each of the ingots were removed by facing. The ingots were hot-rolled at 950° C. to obtain 12 mm thick copper alloy plates. Surface layers of about 1 mm in thickness of the front and the back surface of each copper alloy plate were removed by facing. Many blow holes were formed in the ingot of the copper alloy of the composition No. 23 and cracks formed in the copper alloy plate of the copper alloy having the composition No. 24 during hot rolling. Therefore, the copper alloy plates of the compositions Nos. 23 and 24 were not processed by processes following hot rolling.

TABLE 3

Chemical composition (Percent by mass, **: ppm), Percentage rolling reduction for finish cold rolling (%)

| No. | Ni | P | Zn | Fe | Sn | Other components | O** | H** | S** | Reduction ratio |
|---|---|---|---|---|---|---|---|---|---|---|
| 1 | 0.6 | 0.05 | 0.1 | — | — | — | <100 | <5 | <100 | 50 |
| 2 | 0.6 | 0.05 | 0.02 | — | 1.1 | — | | | | 70 |
| 3 | 0.8 | 0.13 | 0.1 | 0.1 | 0.06 | — | | | | 80 |
| 4 | 0.4 | 0.15 | 0.4 | 0.3 | 0.2 | — | | | | 80 |
| 5 | 1.6 | 0.27 | 0.1 | 0.1 | 0.06 | — | | | | 65 |
| 6 | 0.13 | 0.01 | 0.1 | — | 1 | — | | | | 90 |
| 7 | 0.8 | 0.13 | 3 | 0.1 | 0.06 | — | | | | 80 |
| 8 | 0.8 | 0.13 | 0.1 | 0.7 | 0.06 | — | | | | 75 |
| 9 | 0.8 | 0.13 | 0.1 | 0.1 | 0.06 | 0.05Mn, 0.1Co | | | | 80 |
| 10 | 0.8 | 0.13 | 0.1 | 0.1 | 0.06 | 0.05Ti, 0.02B | | | | 80 |
| 11 | 0.8 | 0.13 | 0.1 | 0.1 | 0.06 | 0.1Cr, 0.05Mg 0.03Zr, 0.05In | | | | 80 |
| 12 | 0.6 | 0.05 | 0.02 | — | 1.1 | — | | | | 20 |
| 13 | 0.8 | 0.13 | 0.1 | 0.1 | 0.06 | — | | | | 30 |
| 14 | 3.0* | 0.007* | 10* | — | — | — | | | | 50 |
| 15 | 2.0 | 0.03 | 0.15 | 2* | — | — | | | | 80 |
| 16 | 0.07 | 0.01 | 0.01 | — | 3.5* | — | | | | 45 |
| 17 | 0.03* | 0.0005* | 0.003* | — | — | — | | | | 60 |
| 18 | — | 0.03 | — | 0.1 | — | — | | | | 30 |
| 19 | 3.2 | — | 0.3 | — | 1.25 | 0.7Si | | | | 20 |
| 20 | 0.8 | 0.13 | 0.1 | 0.1 | 0.06 | 0.1Mn, 0.12Cr* | | | | 80 |
| 21 | 0.8 | 0.13 | 0.1 | 0.1 | 0.06 | 0.1Be, 0.1Al* | | | | 80 |
| 22 | 0.8 | 0.13 | 0.1 | 0.1 | 0.06 | — | 120 | 1 | 20 | 80 |
| 23 | 0.8 | 0.13 | 0.1 | 0.1 | 0.06 | — | 50 | 10 | 50 | — |
| 24 | 0.8 | 0.13 | 0.1 | 0.1 | 0.06 | — | 40 | 2 | 110 | — |

No. 18: Cu—Fe—P alloy
No. 19: Cu—Ni—Si alloy
*Excessive or insufficient content

The copper alloy plates were subjected to cold rolling, annealing and finish cold rolling to obtain copper alloy sheets of 0.15 mm in thickness. Annealing heated the copper alloy sheets at a temperature in the range of 200° C. to 600° C. for a time in the range of 0.5 to 10 h. Annealing conditions were selectively determined such that re-crystallized grains had a mean grain size of 50 μm or below or re-crystallization would not occur. The copper alloy sheets were cold-rolled in a thickness such that the percentage rolling reduction for the finish cold rolling was 20% or above. Percentage rolling reductions for finish cold rolling are shown in Table 3.

The copper alloy sheets processed by finish cold rolling were subjected to low-temperature annealing for a time in the range of about 20 to about 300 s. Conditions for low-temperature annealing were selectively determined such that the MHv of each of the copper alloy sheets processed by low-temperature annealing was in the range of 65% to 95% of the MHv of the copper alloy sheet before low-temperature annealing.

Test pieces were sampled from the copper alloy sheets of the copper alloys having the compositions Nos. 1 to 22. Test pieces were subjected to property tests including a MHv test, a uniform elongation test, a local elongation test, a drag burr length measuring test a blade abrasion test, an electric conductivity test and a solder wettability test. Measured data is shown in Table 4.

Test procedures for measuring hardness, uniform elongation, local elongation and electric conductivity, evaluating solder wettability, measuring lead drag burr length and abrasion loss of dicing blades were the same as the first embodiment.

TABLE 4

| | | | | Length of drag burrs (μm) | | Abrasion of the dicing blade (μm) | | | |
|---|---|---|---|---|---|---|---|---|---|
| No. | Hardness (Hv) | Uniform elongation (%) | Local elongation (%) | Resin-bonded diamond dicing blade | Electrocast diamond dicing blade | Resin-bonded diamond dicing blade | Electrocast diamond dicing blade | Electric conductivity (% IACS) | Solder wettability |
| 1 | 150 | 4 | 4 | 50 | 52 | 57 | 0.25 | 70 | ○ |
| 2 | 185 | 5 | 3.5 | 53 | 56 | 58 | 0.25 | 40 | ○ |
| 3 | 200 | 3 | 5 | 48 | 45 | 41 | 0.25 | 62 | ○ |
| 4 | 185 | 3 | 7 | 48 | 51 | 58 | 0.25 | 65 | ○ |
| 5 | 230 | 2 | 4 | 47 | 46 | 40 | 0.24 | 50 | ○ |
| 6 | 185 | 5 | 3.5 | 53 | 55 | 57 | 0.25 | 42 | ○ |
| 7 | 205 | 3 | 5 | 49 | 45 | 40 | 0.25 | 53 | ○ |
| 8 | 190 | 5 | 4 | 53 | 55 | 57 | 0.25 | 41 | ○ |
| 9 | 202 | 3 | 5 | 47 | 46 | 40 | 0.25 | 63 | ○ |
| 10 | 203 | 3 | 5 | 47 | 45 | 40 | 0.25 | 61 | ○ |
| 11 | 205 | 3 | 5 | 47 | 45 | 40 | 0.25 | 65 | ○ |

TABLE 4-continued

| | | | | Length of drag burrs (μm) | | Abrasion of the dicing blade (μm) | | | |
|---|---|---|---|---|---|---|---|---|---|
| | | Uniform | Local | Resin-bonded | Electrocast | Resin-bonded | Electrocast | Electric conductivity | |
| | Hardness | elongation | elongation | diamond | diamond | diamond | diamond | (% | Solder |
| No. | (Hv) | (%) | (%) | dicing blade | dicing blade | dicing blade | dicing blade | IACS) | wettability |
| 12 | 140* | 6* | 4 | 65* | 66* | 71* | 0.2 | 40 | ○ |
| 13 | 140* | 4 | 6 | 64* | 65* | 70* | 0.2 | 63 | ○ |
| 14 | 160 | 4 | 5 | 50 | 52 | 57 | 0.25 | 21* | ○ |
| 15 | 160 | 5 | 4 | 66* | 45 | 91* | 0.2 | 37 | ○ |
| 16 | 210 | 4 | 4 | 49 | 48 | 45 | 0.24 | 22* | ○ |
| 17 | 150 | 5 | 11* | 62* | 63* | 71* | 0.3 | 97 | ○ |
| 18 | 120* | 6* | 4 | 66* | 68* | 77* | 0.2 | 90 | ○ |
| 19 | 200 | 8* | 4 | 69* | 52 | 70* | 0.2 | 35 | ○ |
| 20 | 210 | 4 | 4 | 57 | 58 | 72* | 0.25 | 55 | x* |
| 21 | 220 | 3 | 4 | 47 | 46 | 40 | 0.24 | 50 | x* |
| 22 | 190 | 4 | 6 | 50 | 54 | 42 | 0.27 | 61 | x* |

*Unsatisfactory property

As shown in Table 4, in the copper alloy sheets of the copper alloys having the compositions Nos. 1 to 11, having a MHv, a uniform elongation and a local elongation meeting the requirements of the second embodiment, the lengths of lead burrs formed therein when the packages were cut by either of the resin-bonded diamond dicing blade and the electrocast diamond dicing blade were 60 μm or below. Abrasion losses in the resin-bonded diamond dicing blade and the electrocast diamond blade used for cutting the packages were below 70 μm. The measured data proved the excellent dicing workability of the lead frames. The lead frames of the copper alloys having the compositions Nos. 3, 5, 7, and 9 to 10 having uniform elongations and local elongations in the desired ranges were particularly excellent in dicing workability.

In the lead frames of the copper alloys having the compositions Nos. 12, 13, and 17 to 19 having a MHv, a uniform elongation or a local elongation not meeting the requirements of the second embodiment, the lengths of lead burrs formed therein when the packages were cut by either of the resin-bonded diamond dicing blade and the electrocast diamond dicing blade were above 60 μm. An abrasion loss in the resin-bonded diamond dicing blade used for cutting the packages was above 70 μm, which proved that those copper alloy sheets were unsatisfactory in dicing workability.

The lead frame of the copper alloy having the compositions No. 14 having an excessively high Ni content had a low electric conductivity. The lead frame of the copper alloy having the composition No. 15 having an excessively high Fe content was inferior in dicing workability and electric conductivity. The lead frame of the copper alloy having the composition No. 16 having an excessively high Sn content had a low electric conductivity. The lead frames of the copper alloys having the compositions Nos. 20 and 21 excessively containing the subsidiary elements and the lead frame of the copper alloy having the composition No 22 were unsatisfactory in solder wettability.

What is claimed is:

1. A QFN package comprising a lead frame made by processing a copper alloy sheet of a copper alloy containing 0.01 to 0.50% by mass Fe, 0.01 to 0.20% by mass P, and Cu and inevitable impurities as other components, having a micro Vickers hardness of 150 or above, a uniform elongation of 5% or below and a local elongation of 10% or below.

2. The QFN package according to claim 1, wherein the copper alloy further contains 0.005 to 5% by mass Sn.

3. The QFN package according to claim 1, wherein the copper alloy further contains 0.005 to 3.0% by mass Zn.

4. The QFN package according to claim 1, wherein the copper alloy further contains 0.2% by mass or below Co, Cr Mn and Mg in total.

5. The QFN package according to claim 1, wherein the copper alloy further contains 0.1% by mass or below Al, Ag, B, Be, In, Si, Ti and Zr in total.

6. The QFN package according to claim 1, wherein the copper alloy contains 100 ppm or below O, 5 ppm or below H and 100 ppm or below S.

7. A lead frame of a copper alloy for the QFN package according to claim 1.

8. A QFN package comprising a lead frame made by processing a copper alloy sheet of a copper alloy containing 0.05 to 2% by mass Ni, 0.001 to 0.3% by mass P, 0.005 to 5% by mass Zn, and Cu and inevitable impurities as other components, having a micro Vickers hardness of 150 or above, a uniform elongation of 5% or below and a local elongation of 10% or below.

9. The QFN package according to claim 8, wherein the copper alloy further contains at least either of 1% by mass or below Fe and 1.5% by mass or below Sn.

10. The QFN package according to claim 8, wherein the copper alloy further contains 0.2% by mass or below Co, Cr, Mn, Mg and Si in total.

11. The QFN package according to claim 8, wherein the copper alloy further contains 0.1% by mass or below Al, Zr, In, Ti, B, Ag and Be in total.

12. The QFN package according to claim 8, wherein the copper alloy contains 100 ppm or below O, 5 ppm or below H and 100 ppm or below S.

13. A lead frame of a copper alloy for the QFN package according to claim 8.

* * * * *